(12) United States Patent
Lee et al.

(10) Patent No.: US 10,204,184 B2
(45) Date of Patent: Feb. 12, 2019

(54) APPARATUS AND METHOD FOR MODELING CULTURAL HERITAGE BUILDING

(71) Applicant: ELECTRONICS AND TELECOMMUNICATIONS RESEARCH INSTITUTE, Daejeon (KR)

(72) Inventors: Ji-Hyung Lee, Daejeon (KR); Kyung-Kyu Kang, Seoul (KR); Jae-Woo Kim, Daejeon (KR); Dong-Wan Ryoo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 420 days.

(21) Appl. No.: 14/993,521

(22) Filed: Jan. 12, 2016

(65) Prior Publication Data
US 2016/0217224 A1    Jul. 28, 2016

(30) Foreign Application Priority Data
Jan. 27, 2015   (KR) .................. 10-2015-0012501

(51) Int. Cl.
*G06F 17/50*    (2006.01)
(52) U.S. Cl.
CPC ................... *G06F 17/5004* (2013.01)
(58) Field of Classification Search
CPC ..... G06F 17/5004; G06T 17/10; G06T 19/20; G06T 2210/04
See application file for complete search history.

(56) References Cited

U.S. PATENT DOCUMENTS

| 2009/0273598 A1* | 11/2009 | Reghetti ................. G06F 17/50 345/419 |
| 2011/0185272 A1* | 7/2011 | Rajkumar ............... G06F 17/50 715/234 |

(Continued)

FOREIGN PATENT DOCUMENTS

| EP | 2 135 222 B1 | 8/2010 |
| KR | 10-2013-0070112 A | 6/2013 |

(Continued)

OTHER PUBLICATIONS

Allen et al.,"3D Modeling of Historic Sites Using Range and Image Data" (2003), Proceedings of the 2003 IEEE International Conference on Robotics & Automation, pp. 1-6 [retrieved from http://web1.cs.columbia.edu/~allen/PAPERS/ra03.pdf].*

(Continued)

*Primary Examiner* — Brian W Wathen
(74) *Attorney, Agent, or Firm* — LRK Patent Law Firm

(57) ABSTRACT

An apparatus and method for modeling a cultural heritage building, which may intuitively model a 3D digital cultural heritage building while exhibiting the characteristics of the 3D digital cultural heritage building, through the use of a touch screen UI on a smart mobile device in a place where it is difficult to use a PC or existing software. The disclosed apparatus includes a measured drawing arrangement unit for displaying, on a touch screen, measured drawings that include information about members constituting a cultural heritage building, a member model generation unit for performing modeling based on multiple points input via the touch screen, thus generating 3D member models, a database for storing the member models generated by the member model generation unit, and a member arrangement unit for arranging each of the stored member models at an original location thereof based on the measured drawings.

18 Claims, 14 Drawing Sheets

(56) References Cited

U.S. PATENT DOCUMENTS

| | | | |
|---|---|---|---|
| 2013/0212513 A1* | 8/2013 | Loberg | G06F 17/5004 |
| | | | 715/771 |
| 2014/0125671 A1* | 5/2014 | Vorobyov | G01C 11/00 |
| | | | 345/427 |
| 2014/0218315 A1 | 8/2014 | Jeong | |
| 2014/0292747 A1 | 10/2014 | Lee | |
| 2014/0359541 A1 | 12/2014 | Park | |
| 2015/0089344 A1* | 3/2015 | Pickering | G06F 17/5004 |
| | | | 715/215 |

FOREIGN PATENT DOCUMENTS

| | | |
|---|---|---|
| KR | 10-2014-0073748 A | 6/2014 |
| KR | 10-2014-0099756 A | 8/2014 |
| KR | 10-2014-0120156 A | 10/2014 |

OTHER PUBLICATIONS

Lewis et al., "Generation of 3D building models from 2D architectural plans" (1998), Computer-Aided Design, vol. 30, No. 10, pp. 765-779 [retrieved from https://doi.org/10.1016/S0010-4485(98)00031-1].*

Mark Foskey et al., "ArtNova: Touch-Enabled 3D Model Design," IEEE Virtual Reality, 2002.

* cited by examiner

CROSS-BEAM DIRECTION
(LONGITUDINAL) SMALL ANCON

BEAM DIRECTION (TRANSVERSE)
SMALL ANCON

CROSS-BEAM DIRECTION
(LONGITUDINAL) LARGE ANCON

APPARATUS AND METHOD FOR MODELING CULTURAL HERITAGE BUILDING

CROSS REFERENCE TO RELATED APPLICATION

This application claims the benefit of Korean Patent Application No. 10-2015-0012501, filed Jan. 27, 2015, which is hereby incorporated by reference in its entirety into this application.

BACKGROUND OF THE INVENTION

1. Technical Field

The present invention generally relates to an apparatus and method for modeling a cultural heritage building, and more particularly, to an apparatus and method for modeling a cultural heritage building, which perform three-dimensional (3D) modeling on a cultural heritage building using equipment that uses a touch screen as a main user interface (UI), such as a smart phone, a smart pad, or a kiosk.

2. Description of the Related Art

Digital cultural heritage buildings are created by faithfully copying actual cultural heritage buildings in a digital manner, and have been produced via 3D modeling based on computer graphics technology.

Existing cultural heritage buildings must be modeled based on 3D scanning or measured drawings by performing 3D scanning or producing the measured drawings. Lost cultural properties have been estimated based on data and have been virtually created.

In order to desirably reconstruct digital cultural heritage buildings, buildings must be modeled using not only the procedure of modeling the outward appearance of each building, but also the procedure of reflecting the architectural structure and utilizing the members of the building.

Since existing 3D modeling software is designed to be controlled using an input device such as a keyboard or a mouse, a user may feel inconvenience when modeling a digital cultural heritage building based on a touch screen input.

Recently, with the development of smart mobile devices, technology for modeling a 3D cultural heritage building at a heritage building reconstruction site is required.

As related preceding technologies related to the present invention, Korean Patent Application Publication No. 2014-0120156 (entitled "Method of Generating 3-D Graphic Data with Improved Usability for Mobile Device and Application Development Environment Enabling the Method") and Korean Patent Application Publication No. 2014-0099756 (entitled "Method for Handling 3-Dimensional Scanning Data for Excavation and Analysis of Cultural Assets") are disclosed.

SUMMARY OF THE INVENTION

Accordingly, the present invention has been made keeping in mind the above problems occurring in the prior art, and an object of the present invention is to provide an apparatus and method for modeling a cultural heritage building, which may intuitively model a 3D digital cultural heritage building while exhibiting the characteristics of the 3D digital cultural heritage building, through the use of a touch screen UI on a smart mobile device in a place where it is difficult to use a PC, existing software (S/W), etc. as in the case of the site of cultural properties.

In accordance with an aspect of the present invention to accomplish the above object, there is provided an apparatus for modeling a cultural heritage building, including a measured drawing arrangement unit for displaying, on a touch screen, measured drawings that include information about members constituting a cultural heritage building; a member model generation unit for performing modeling based on multiple points input via the touch screen, thus generating three-dimensional (3D) member models; a database for storing the member models generated by the member model generation unit; and a member arrangement unit for arranging each of the member models, stored in the database, at an original location thereof based on the measured drawings.

The information about the members constituting the cultural heritage building may include one or more of an actual size, an arrangement location, and a scale of each member.

The member model generation unit may generate objects based on the multiple points input in conformity with the measured drawings via the touch screen, and generate the 3D member models by performing mesh generation and texture mapping on the objects.

The member arrangement unit may be configured to, when a member model to be arranged is selected, arrange the member model to match a corresponding location on the measured drawings via transform manipulation.

The apparatus may further include a member model revision unit for revising a certain member model stored in the database.

The member model revision unit may include a member model editing unit configured to, when an editing target is determined from the member models stored in the database, edit the editing target via transform manipulation.

The member model editing unit may perform one or more of translation, rotation, and scaling on the editing target.

The member model revision unit may include a mesh deformation unit configured to perform mesh deformation on a certain member model stored in the database.

The member model revision unit may include a member model editing unit configured to, when an editing target is determined from the member models stored in the database, edit the editing target via transform manipulation; and a mesh deformation unit configured to perform mesh deformation on a certain member model stored in the database.

The member model revision unit may store the revised member model in the database.

In accordance with another aspect of the present invention to accomplish the above object, there is provided a method for modeling a cultural heritage building, including displaying, by a measured drawing arrangement unit, on a touch screen, measured drawings that include information about members constituting a cultural heritage building; performing, by a member model generation unit, modeling based on multiple points input via the touch screen, thus generating three-dimensional (3D) member models; storing, by the member model generation unit, the member models in a database; and arranging, by a member arrangement unit, each of the member models, stored in the database, at an original location thereof based on the measured drawings.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
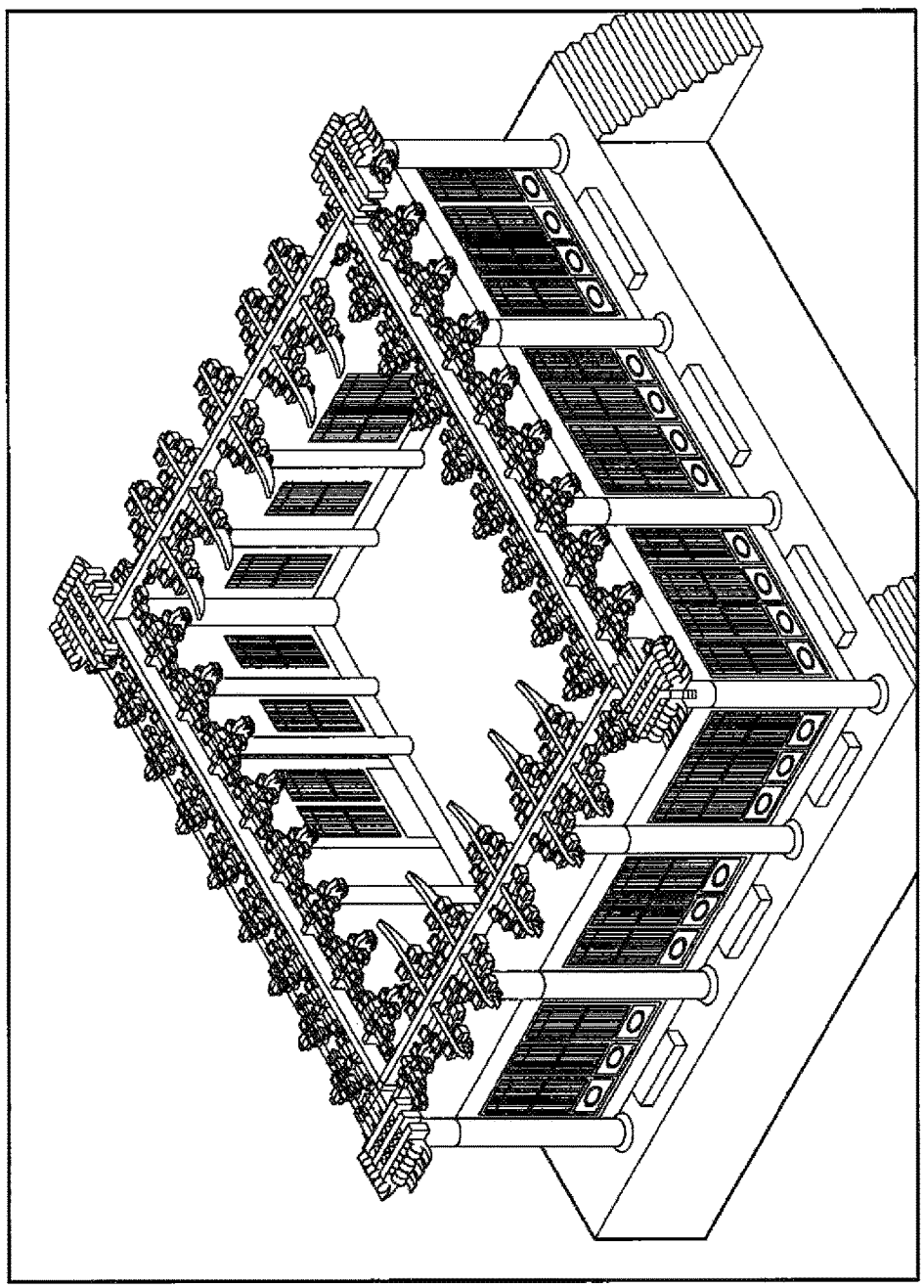
FIG. 1 is a diagram illustrating members constituting a building employed in an embodiment of the present invention.

The present invention may be variously changed and may have various embodiments and specific embodiments will be described in detail below with reference to the attached drawings.

However, it should be understood that those embodiments are not intended to limit the present invention to specific disclosure forms and they include all changes, equivalents or modifications included in the spirit and scope of the present invention.

The terms used in the present specification are merely used to describe specific embodiments and are not intended to limit the present invention. A singular expression includes a plural expression unless a description to the contrary is specifically pointed out m context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present invention pertains. The terms identical to those defined in generally used dictionaries should be interpreted as having meanings identical to contextual meanings of the related art, and are not interpreted as being ideal or excessively formal meanings unless they are definitely defined in the present specification.

Embodiments of the present invention will be described in detail with reference to the accompanying drawings. In the following description of the present invention, the same reference numerals are used to designate the same or similar elements throughout the drawings and repeated descriptions of the same components will be omitted.

Figure 2:
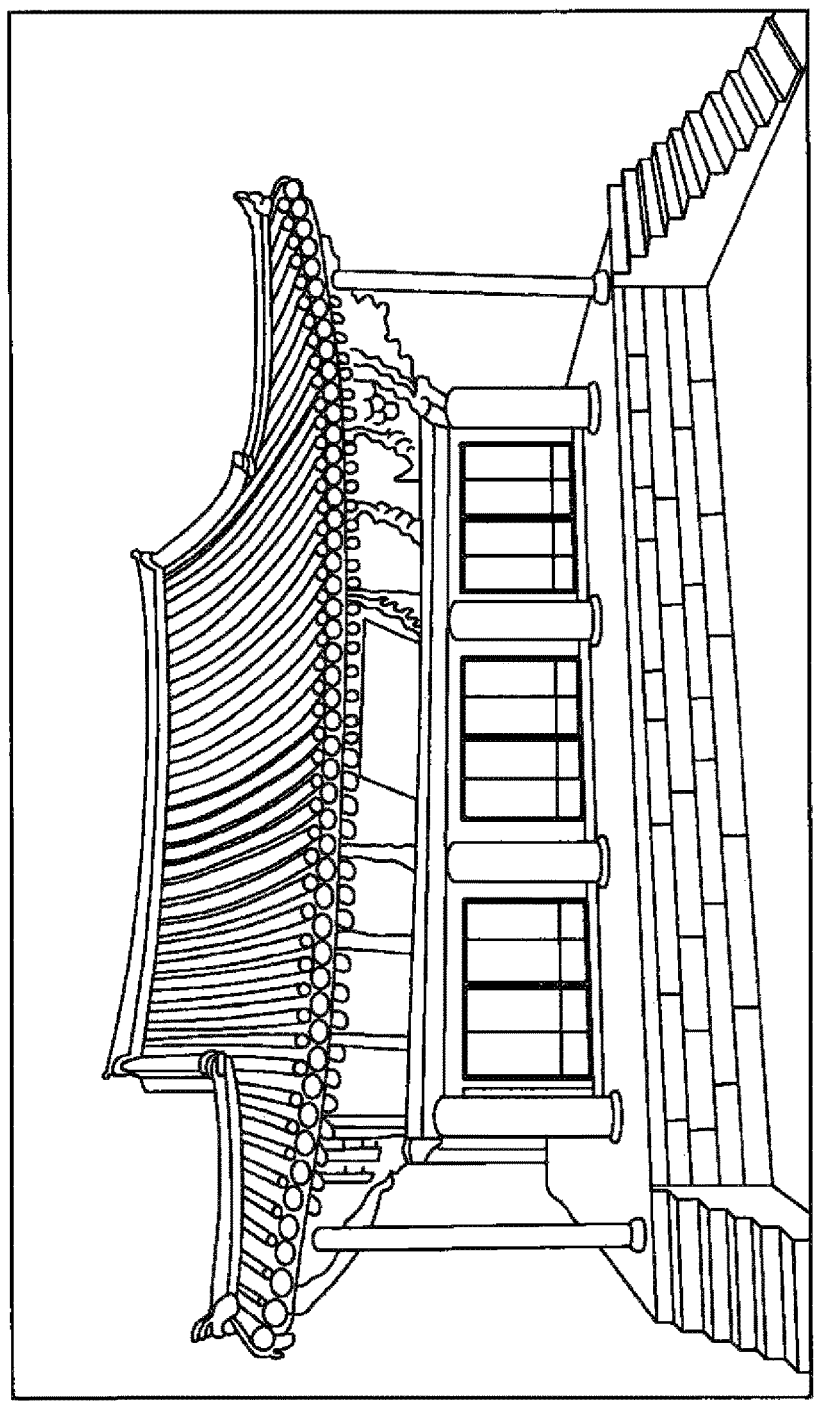
FIG. 2 is a diagram showing an example of a digital cultural heritage building completed according to an embodiment of the present invention.
Figure 3:
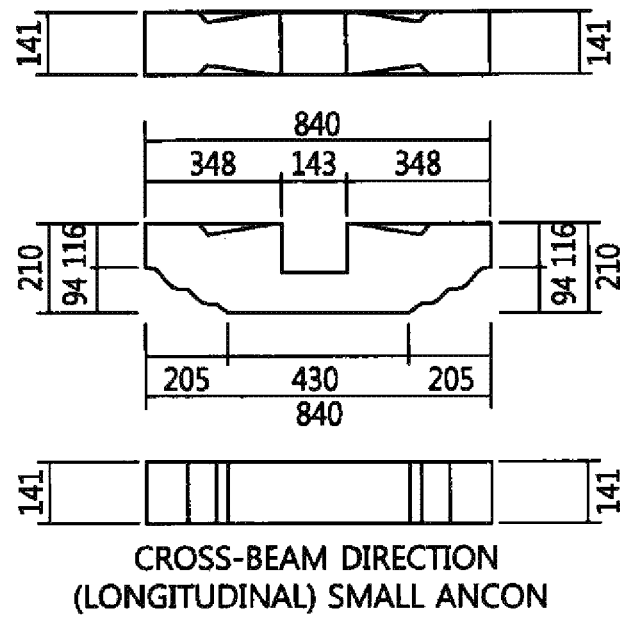
FIGS. 3 to 6 are diagrams showing examples of a measured drawing employed in the embodiment of the present invention.
Figure 3:
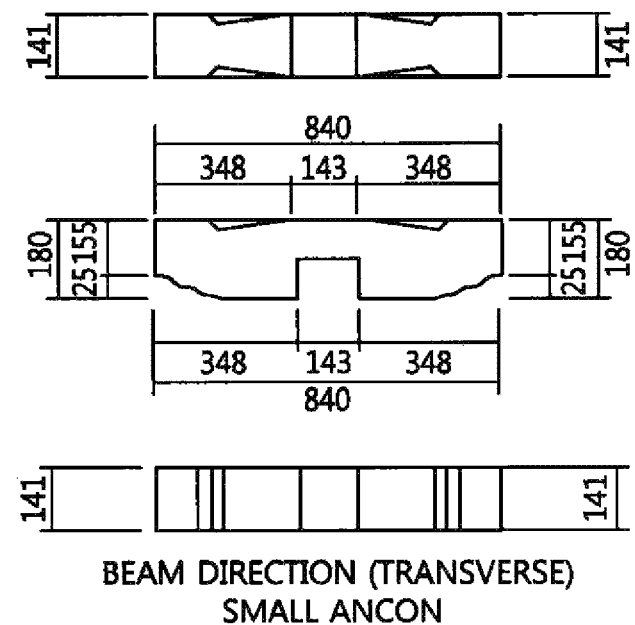
Figure 4:
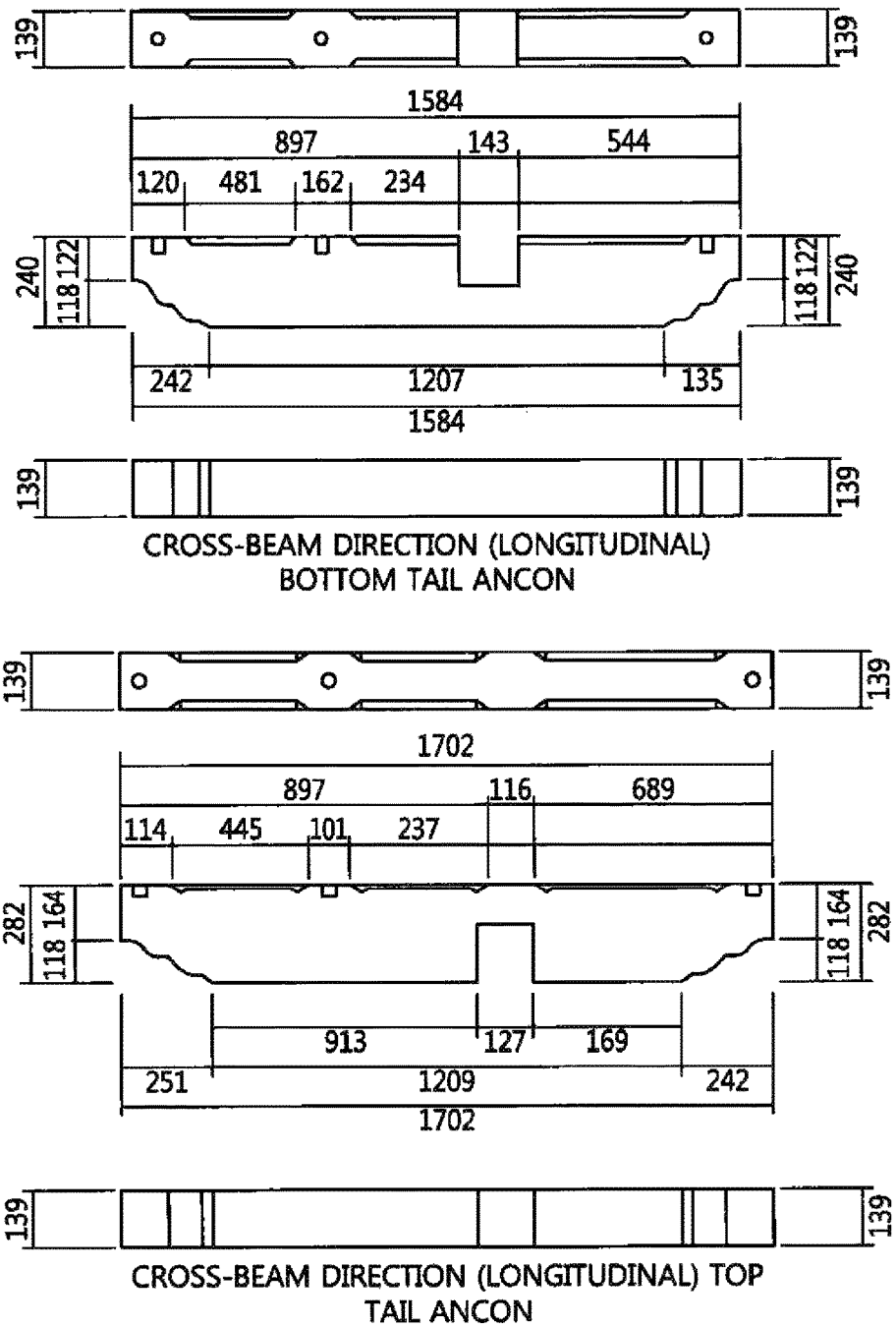
Figure 5:
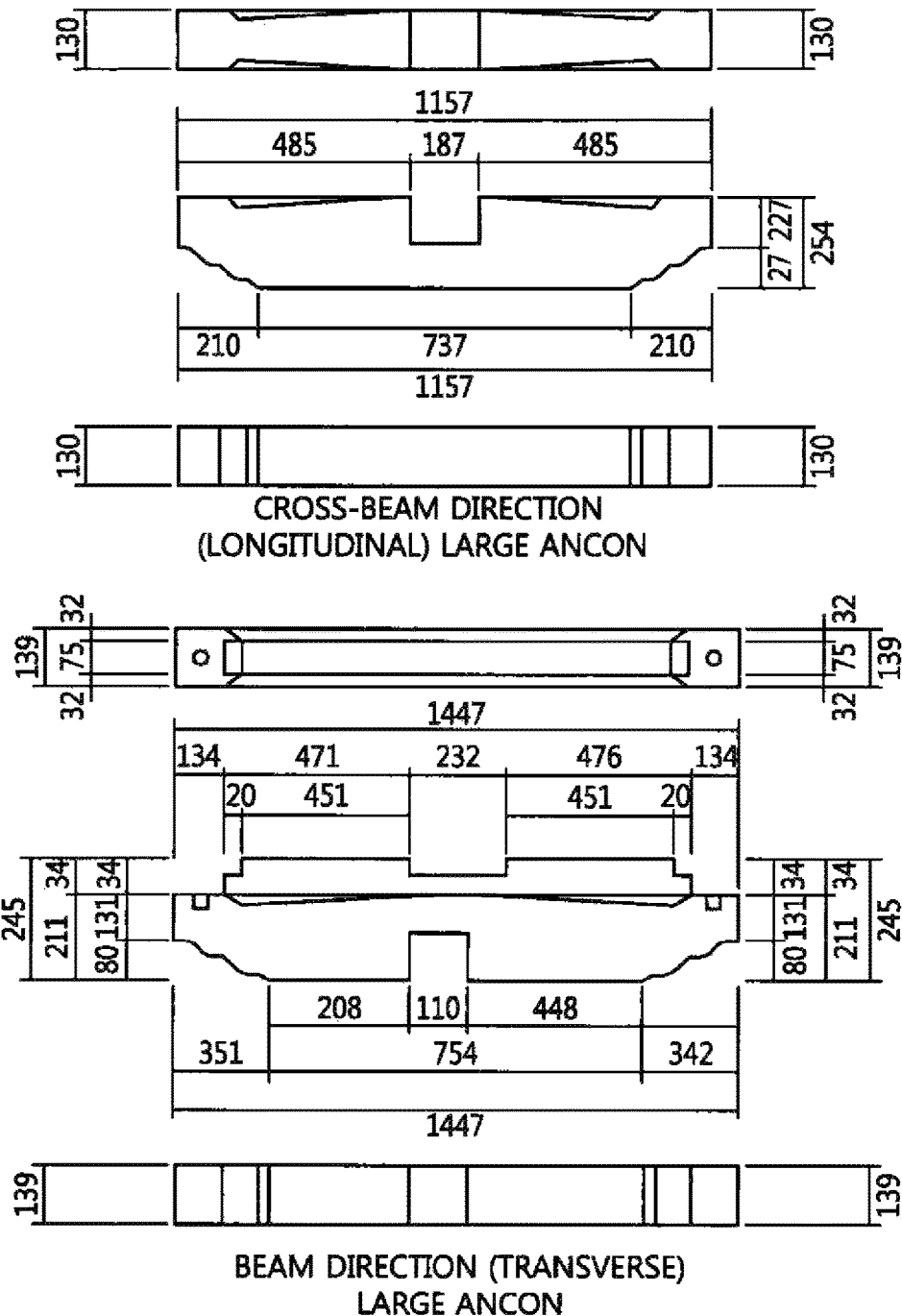
Figure 6:
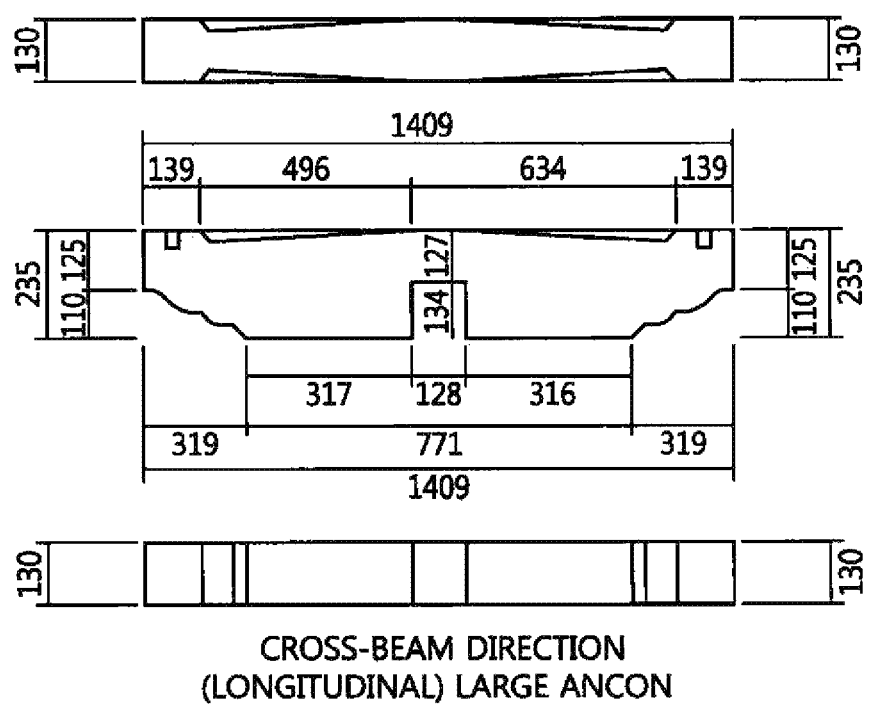
Figure 7:
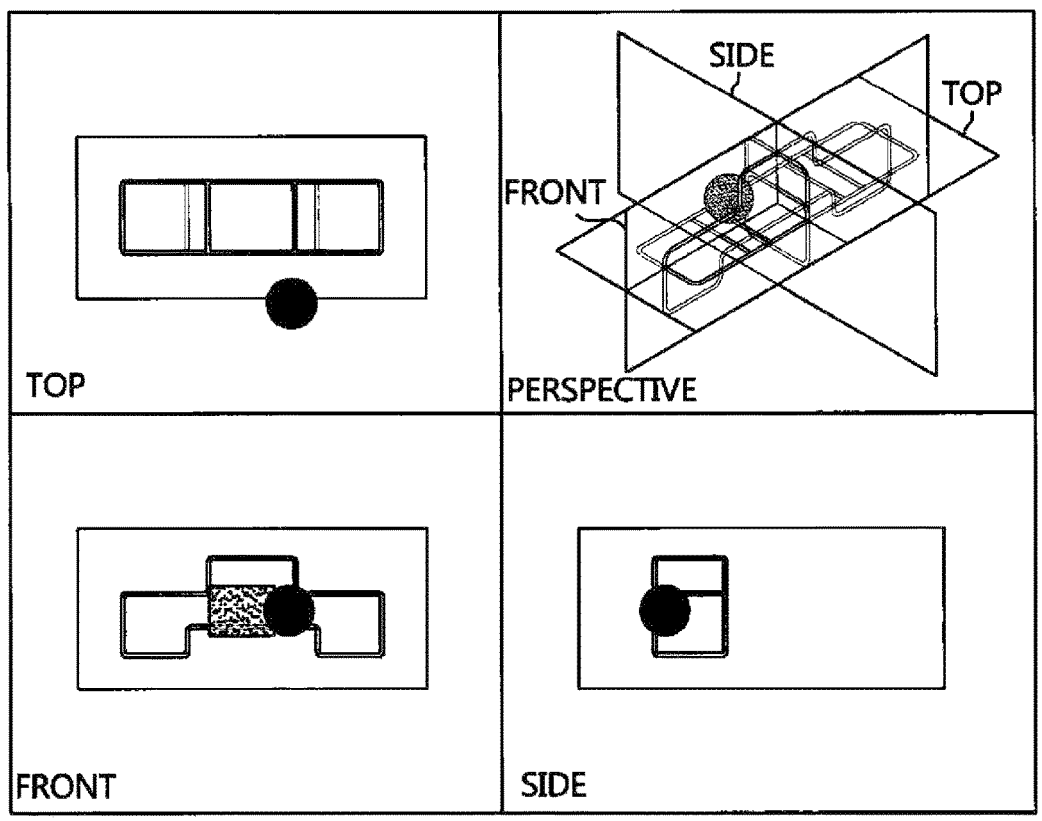
FIG. 7 is a diagram showing an example of arrangement of the measured drawing according to an embodiment of the present invention.
Figure 8:
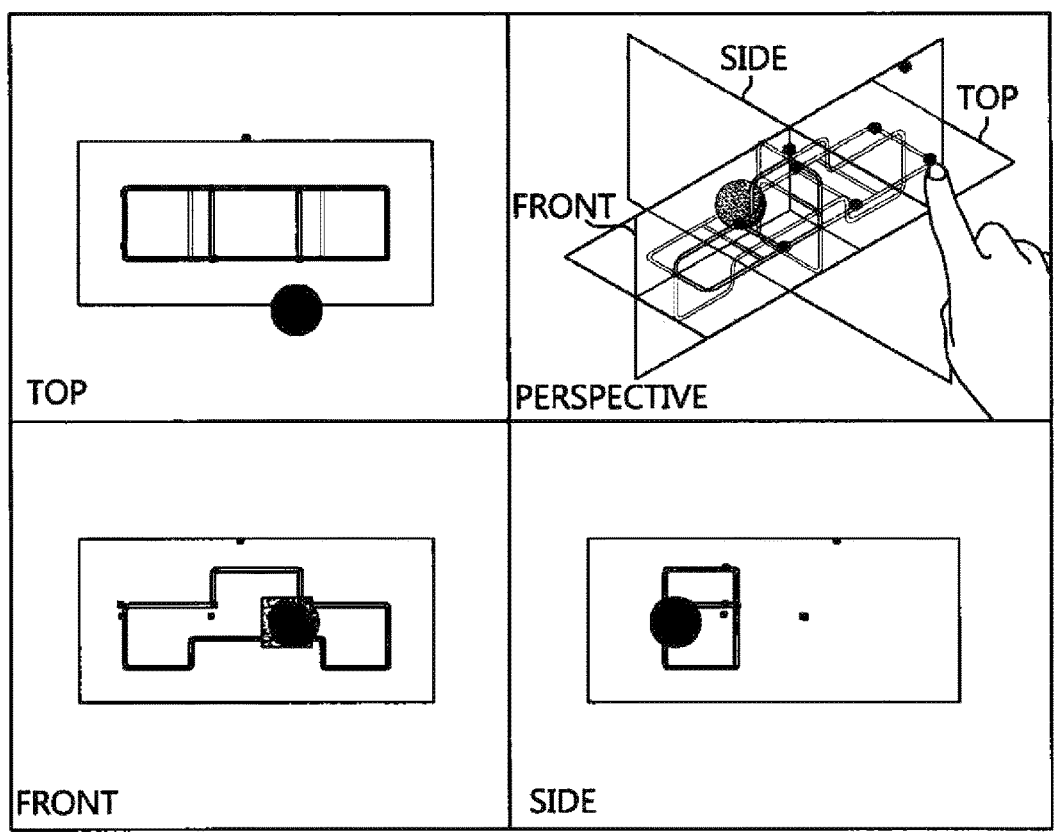
FIG. 8 is a diagram showing 3D modeling using a single finger according to an embodiment of the present invention.
Figure 9:
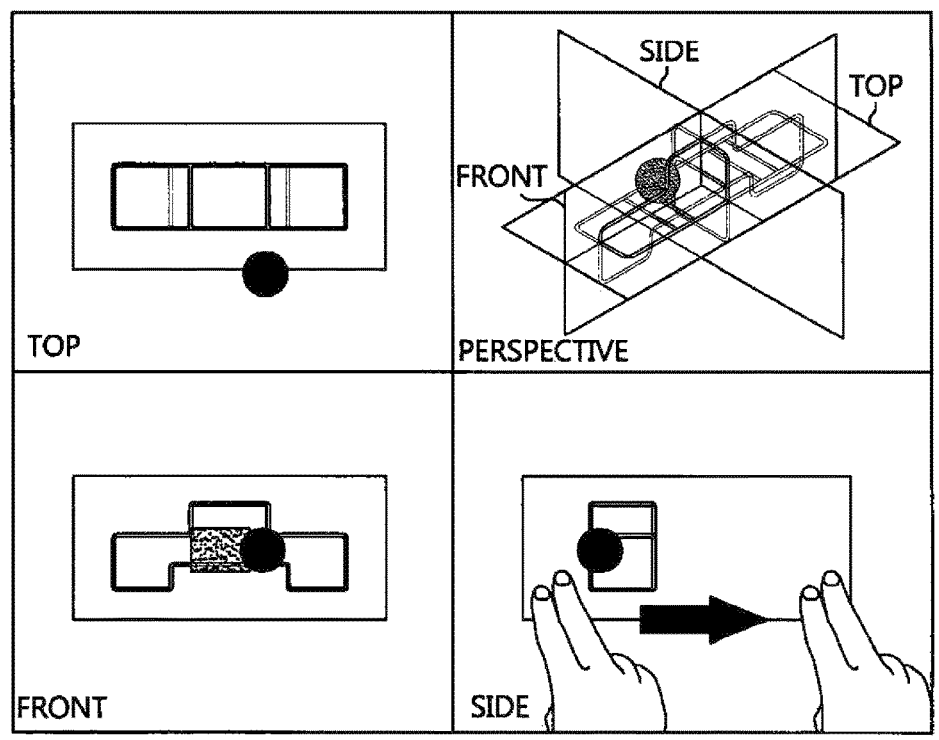
FIG. 9 is a diagram showing screen control using two fingers according to an embodiment of the present invention.

FIG. 1 is a diagram illustrating members constituting a building employed in an embodiment of the present invention, FIG. 2 is a diagram showing an example of a digital cultural heritage building completed according to an embodiment of the present invention, FIGS. 3 to 6 are diagrams showing examples of a measured drawing employed in the embodiment of the present invention, FIG. 7 is a diagram showing an example of arrangement of the measured drawing according to an embodiment of the present invention, FIG. 8 is a diagram showing 3D modeling using a single finger according to an embodiment of the present invention, and FIG. 9 is a diagram showing screen control using two fingers according to an embodiment of the present invention.

The present invention is intended to allow a user to intuitively perform 3D modeling of a cultural heritage building using a touch screen UI. For this, the present invention solves two objects, that is, a 3D modeling method for a digital cultural heritage building in which the characteristics of the corresponding cultural heritage building are reflected, and a 3D geometric modeling method which is optimized for a touch screen UI.

First, the first object, which is a 3D modeling method for a digital cultural heritage building in which the characteristics of the cultural heritage building are reflected, will be described below. The characteristics of the cultural heritage building to be reflected in a modeling procedure are as follows.

1) The modeling result must reflect the size of the actual cultural heritage building. This means that the modeling result must match the actual size, and the scale of sizes of the members must be equal to each other.

2) The modeling result must reflect the internal structure of a cultural heritage building. The cultural heritage building is composed of members constituting the building (see FIG. 1) without being formed as an integrated body. Therefore, to enable modeling in which the internal structure of a cultural heritage building is reflected, there is a need to model the digital cultural heritage building (see FIG. 2) by modeling the members at the actual sizes of the members and arranging the members at the actual locations of the members.

To solve the above first object, the present invention performs modeling based on the actual measured drawing of the cultural heritage building. To preserve a cultural heritage building, a Computer Aided Device (CAD) drawing is created according to the currently preserved state (see FIGS. 3 to 6). The present invention is intended to display three measured drawings of the cultural heritage building depending on X, Y, and Z directions of 3D space while overlapping the drawings with each other, and to allow a user to intuitively perceive and determine the space in which the cultural heritage building is located (see FIG. 7). The digital cultural heritage building is completed by performing 3D modeling on individual members using the components of the measured drawings and arranging the 3D-modeled members. By means of this, 3D modeling may be achieved faithfully based on the measured drawings. Therefore, the digital cultural heritage building may be modeled so that the size and scale thereof are equal to the size and scale of the actual cultural heritage building, and the characteristics of the cultural heritage building, such as the internal structure thereof, may be reflected in the modeling result.

Next, a 3D geometric modeling method optimized for a touch screen UI, which is the second object, will be described. To perform 3D geometric modeling optimized for a touch screen UI, a finger touch and a gesture-related UI on a touch screen are defined. For example, a touch and a gesture using a single finger are used to model a digital cultural heritage building, such as by generating and editing member objects (see FIG. 8). A touch and a gesture using two fingers are used for screen control (see FIG. 9). Such gesture definition may be freely set according to the preference of the user.

As 3D geometric modeling, there are various methods with the development of graphics technology. However, the present invention uses basic 3D modeling, which generates points on a drawing, generates faces by connecting the points to each other, and then generates a 3D object by collecting the faces, based on various types of touches and gestures, in order to perform 3D geometric modeling optimized for a touch screen UI. Therefore, the 3D modeling used in the present invention is optimized by limiting the conventional 3D modeling method in accordance with the touch screen UI, thus allowing the user to intuitively perform 3D modeling on the digital cultural heritage building.

Figure 10:
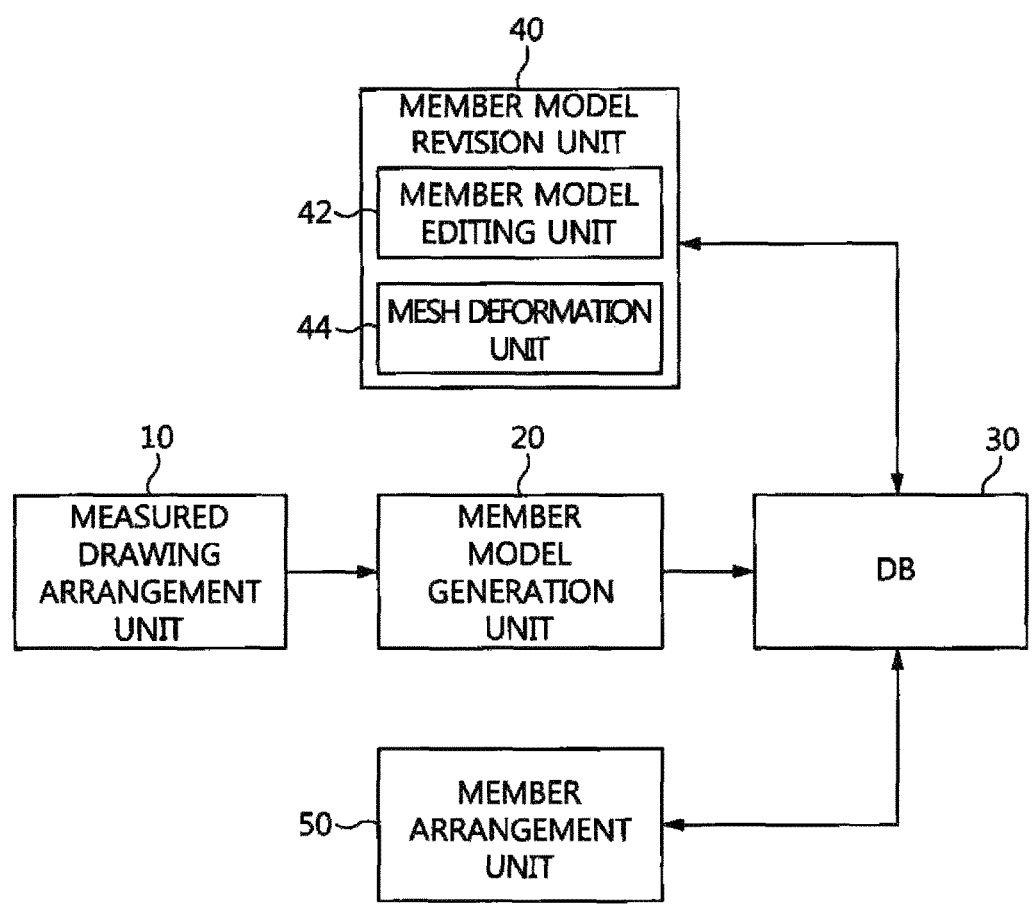
FIG. 10 is a configuration diagram showing an apparatus for modeling a cultural heritage building according to an embodiment of the present invention.

FIG. 10 is a configuration diagram showing an apparatus for modeling a cultural heritage building according to an embodiment of the present invention.

The apparatus for modeling a cultural heritage building according to the embodiment of the present invention includes a measured drawing arrangement unit 10, a member model generation unit 20, a database (DB) 30, a member model revision unit 40, and a member arrangement unit 50. The apparatus for modeling a cultural heritage building according to the embodiment of the present invention is operated based on the touch screen UI of a smart mobile device. Therefore, the measured drawing arrangement unit 10, the member model generation unit 20, the member model revision unit 40, and the member arrangement unit 50 may be regarded as operating in conjunction with the touch screen.

The measured drawing arrangement unit 10 may load the measured drawings (see FIGS. 3 to 6), and locate and adjust the measured drawings so that the locations of the measured drawings match their original locations in 3D space. That is, the measured drawing arrangement unit 10 may display the measured drawings including the information of members constituting the cultural heritage building (e.g. the actual size, arrangement location, and scale of the corresponding member) on a touch screen (not shown).

The member model generation unit 20 may generate 3D member models based on the measured drawings arranged by the measured drawing arrangement unit 10. That is, the member model generation unit 20 may sequentially generate faces and objects based on multiple points depending on the user's touch input on the touch screen in 3D space in conformity with the measured drawings arranged in their original locations. Further, the member model generation unit 20 may check the integrity of the generated objects and transform the objects into a mesh. Furthermore, the member model generation unit 20 may perform texture mapping so that a prepared image of the building is applied to the mesh. As a result of the texture mapping, a 3D member model is generated.

In other words, the member model generation unit 20 generates 3D member models by performing modeling based on multiple points input via the touch screen. More specifically, it may be considered that the 3D member models are generated in such a way as to generate objects based on multiple points input via the touch screen in conformity with the measured drawings and perform mesh generation and texture mapping on the generated objects.

The DB 30 stores the 3D member models generated by the member model generation unit 20. Of course, the DB 30 also stores 3D member models revised by the member model revision unit 40. Consequently, it may be considered that, in the DB 30, multiple 3D member models are stored in the form of data.

The member model revision unit 40 may revise a certain 3D member model generated by the member model generation unit 20. For this operation, the member model revision unit 40 includes a member model editing unit 42 and a mesh deformation unit 44.

The member model editing unit 42 is configured to, when an editing target is determined from the member models stored in the DB 30, edit the corresponding editing target via transform manipulation. Here, for the transform manipulation, translation, rotation, and scaling, which are widely used in existing geometric modeling, may be provided.

The mesh deformation unit 44 may deform a certain 3D member model stored in the DB 30 into another type of model via mesh deformation. That is, if an editing target is determined from the member models stored in the DB 30, the mesh deformation unit 44 may generate another type of model by applying mesh deformation to the corresponding editing target.

The member arrangement unit 50 may arrange member models in conformity with the measured drawings in order to construct a digital cultural heritage building using the member models stored in the DB 30. That is, as the member models to be arranged are selected, the member arrangement unit 50 may arrange the corresponding member models in 3D space via transform manipulation to match the locations of the measured drawings. Finally, a digital cultural heritage building is created using the member arrangement unit 50.

Figure 11:
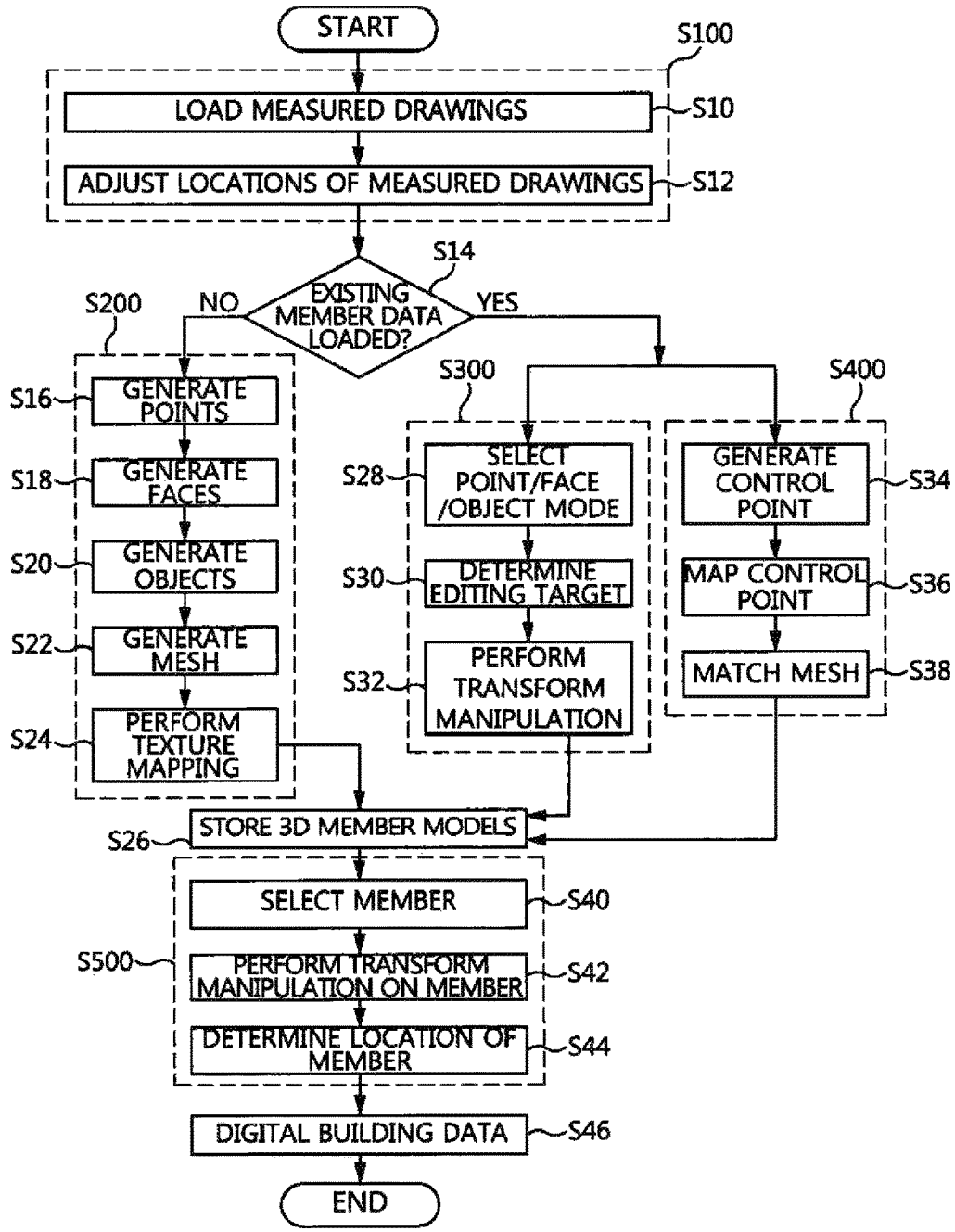
FIG. 11 is a flowchart showing a method for modeling a cultural heritage building according to an embodiment of the present invention.
Figure 12:
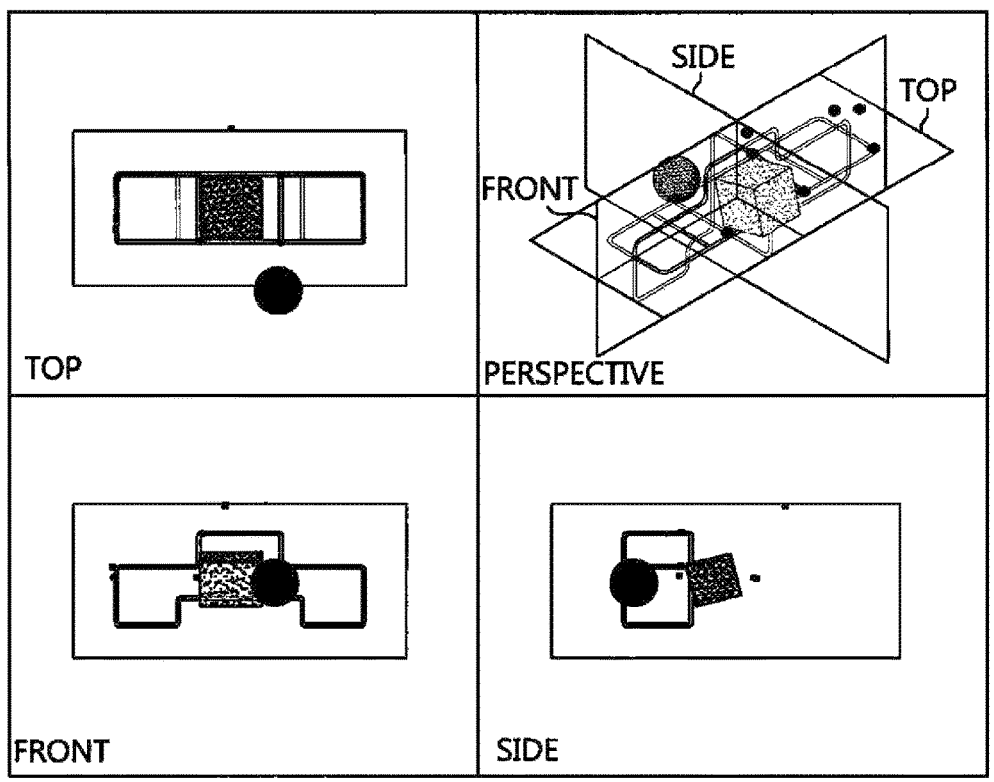
FIG. 12 is a diagram employed in the description of the member editing step of FIG. 11.
Figure 13:
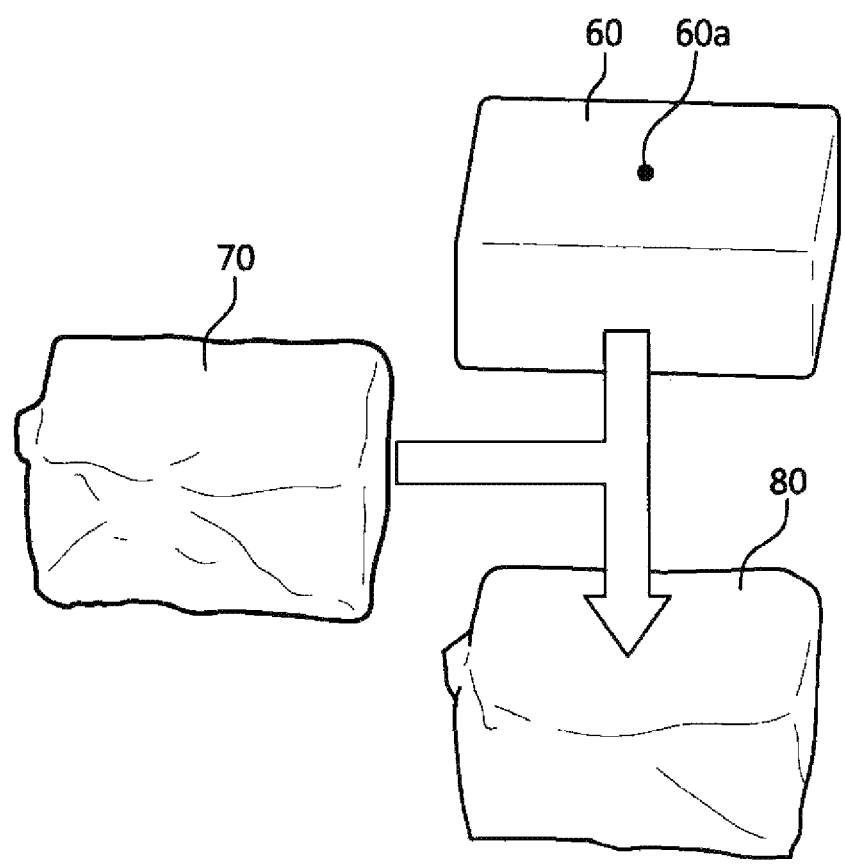
FIG. 13 is a diagram employed in the description of the mesh deformation step of FIG. 11.

FIG. 11 is a flowchart showing a method for modeling a cultural heritage building according to an embodiment of the present invention, FIG. 12 is a diagram employed in the description of the member editing step of FIG. 11, and FIG. 13 is a diagram employed in the description of the mesh deformation step of FIG. 11.

First, a measured drawing arrangement step S100 (including S10 and S12) is performed.

That is, when the user selects measured drawings required for the modeling of a cultural heritage building, the measured drawing arrangement unit 10 loads the corresponding measured drawings at step S10. Thereafter, the user locates and adjusts the measured drawings so that the locations of the measured drawings match their original locations in 3D space. Accordingly, the measured drawing arrangement unit 10 may arrange the measured drawings on the touch screen based on the adjustment information, as shown in FIG. 7, at step S12.

Thereafter, a member model generation step S200 (including S16 to S24) or a member model revision step S300 (including S28 to S32) or S400 (including S34 to S38) is performed depending on whether existing member data (also referred to as "member model data") has been loaded.

If the user selects point/face/object generation modes to generate member models without loading the existing member data, that is, the member model data stored in the DB 30 ("No" at step S14), the member model generation step S200 (including S16 to S24) is performed.

That is, when the user selects a point generation mode from among the point/face/object generation modes on the touch screen and then places points on the measured drawings on the touch screen, the member model generation unit 20 generates points at the corresponding locations so that the points match the measured drawings in the 3D space, as shown in FIG. 8 at step S16. After placing all points, when the user selects a face generation mode, the member model generation unit 20 generates faces by connecting the points at step S18. Thereafter, when the user selects an object generation mode, the member model generation unit 20 generates objects by connecting the faces at step S20. Then, as the user selects the objects, the member model generation unit 20 performs mesh generation and texture mapping at steps S22 and S24. Since those skilled in the art may understand mesh generation and texture mapping by means of well-known existing graphics algorithms, an additional description thereof is omitted. When even the above-described texture mapping has been completed, a single 3D member model is generated at step S26. A digital cultural heritage building is composed of a large number of members, and thus required member models may be generated by repeating the above-described member model generation step S200. The member model generation unit 20 stores multiple generated member models in the DB 30.

Meanwhile, when the user loads the existing member data, that is, member model data stored in the DB 30 ("Yes" at step S14), the member model revision step S300 (including S28 to S32) or S400 (including S34 to S38) is performed. That is, when it is desired to revise the result of member modeling, the modeling result is revised using the member editing step S300 or the mesh deformation step S400.

At the member editing step S300, as the member model stored in the DB 30 is loaded, the user selects point/face/object modes, determines an editing target, and edits the corresponding editing target via transform manipulation, as shown in FIG. 12. Accordingly, the member model revision unit 40 edits the editing target, based on the point/face/object mode selection information, editing target determination information, transform manipulation information, etc. depending on the user's touch on the touch screen at steps S28, S30, and S32. The member model revision unit 40 may edit a single member model in this way. Further, the above-described member editing step S300 may be repeated until all desired member models are edited. The completely edited member models are stored in the DB 30.

The mesh deformation step S400 is configured to, when 3D scan data or the like is additionally prepared, deform the previously generated member model into a complicated model via mesh deformation. By way of this, a member model generated via a simple manipulation is deformed into a complicated member model, and thus the modeling quality and realism of the final digital cultural heritage building may be improved. The mesh deformation step S400 is configured to, as shown in FIG. 13, form a control point 60a on a previously generated member model 60, map the control point 60a, and then perform mesh matching at steps S34, S36, and S38. That is, the member model revision unit 40 matches the existing generated member model 60 with the additionally input data 70 so that the topology and shape of the member model 60 conform to those of the additionally input data 70. As a result, mesh deformation is performed. The above-described deformation step S400 may also be repeatedly applied to desired member models. The member models, having completed their mesh deformation, are stored in the DB 30.

Thereafter, to create a single digital cultural heritage building using member models that have experienced the generation, editing and deformation steps in this way, the member models are arranged one by one to match the measured drawings at step S500. At the arrangement step S500, the user selects any one member model, arranges it in the 3D space to match the locations of the measured drawings via transform manipulation, and determines the location of the member model. Then, the member arrangement unit 50 performs transform manipulation on the selected member model and stores location information about the location determined by the user in the DB 30 at steps S40, S42, and S44. Here, if the user clicks, for example, a location termination button, after arranging the member model in the 3D space via transform manipulation, the member arrangement unit 50 may consider that the member model is to be located at the corresponding location, and may store the corresponding location information.

If step S500 is performed on all member models required for the digital cultural heritage building, a desired digital cultural heritage building is finally created at step S46.

Figure 14:
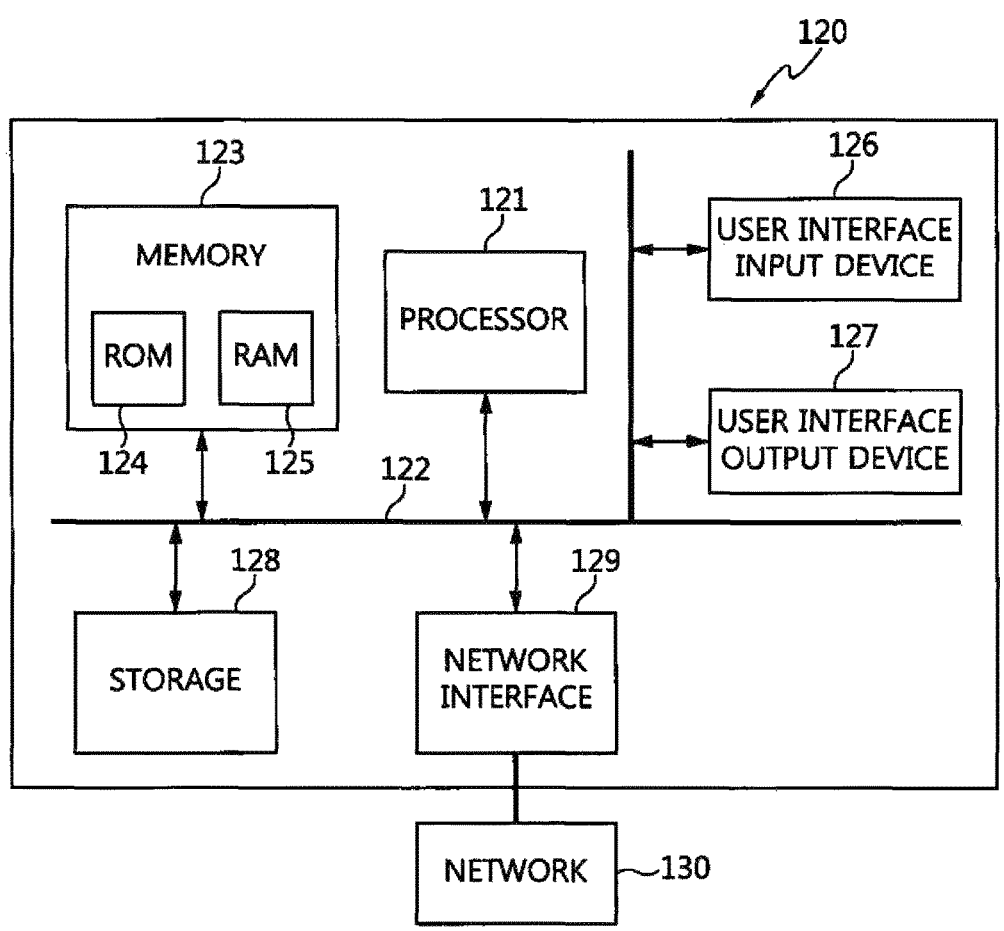
FIG. 14 is a diagram showing a computer system in which the embodiment of the present invention is implemented.

Meanwhile, the above-described embodiment of the present invention may be implemented in a computer system. As shown in FIG. 14, a computer system 120 may include one or more processors 121, memory 123, a user interface input device 126, a user interface output device 127, and storage 128, which communicate with each other through a bus 122. The computer system 120 may further include one or more network interfaces 129 connected to a network 130. Each processor 121 may be either a Central Processing Unit (CPU) or a semiconductor device for executing processing instructions stored in the memory 123 or the storage 128. Each of the memory 123 and the storage 128 may be any of various types of volatile or non-volatile storage media. For example, the memory 123 may include Read Only Memory (ROM) 124 or Random Access Memory (RAM) 125.

Therefore, the embodiment of the present invention may be implemented as a non-temporary computer-readable storage medium in which a computer-implemented method or computer-executable instructions are recorded. When the computer-readable instructions are executed by a processor, the instructions may perform the method according to at least one aspect of the present invention.

In accordance with the present invention having the above configuration, there is an advantage in that 3D modeling of a cultural heritage building is possible even in an environment such as the site of excavation of cultural properties, in which the use of existing office equipment (PC, and UI such as a keyboard or a mouse) is difficult.

Further, since a modeling method is optimized for a touch screen or the like, the present invention is applicable to modern construction sites as well as cultural property sites, and is expected to be applicable to the overall 3D modeling including similar cases related to modeling.

As described above, optimal embodiments of the present invention have been disclosed in the drawings and the specification. Although specific terms have been used in the present specification, these are merely intended to describe the present invention and are not intended to limit the meanings thereof or the scope of the present invention described in the accompanying claims. Therefore, those skilled in the art will appreciate that various modifications and other equivalent embodiments are possible from the embodiments. Therefore, the technical scope of the present invention should be defined by the technical spirit of the claims.

What is claimed is:

1. An apparatus for three dimensional modeling a cultural heritage building to be modeled using a touch screen of a mobile device, comprising:
   at least one unit being configured and executed by a processor using algorithm associated with a non-transitory storage device, the unit comprising, a measured drawing arrangement unit for displaying, on the touch screen, measured drawings that include information about members constituting a building to be modeled;

a member model generation unit for performing modeling based on multiple points to generate three-dimensional (3D) member models, the modeling being performed by sequentially generating faces by connecting the multiple points and sequentially generating objects by connecting the faces, and in conformity with the measured drawings which being arranged in their original locations, and in response to detection of selection of the generated objects, generating the 3D member models by performing mesh generation and texture mapping on the objects, wherein the generated objects are transformed into a mesh;

a database for storing the member models generated by the member model generation unit; and a member arrangement unit for arranging each of the member models, stored in the database, at an original location thereof based on the measured drawings.

2. The apparatus of claim 1, wherein the information about the members constituting the building to be modeled includes one or more of an actual size, an arrangement location, and a scale of each member.

3. The apparatus of claim 1, wherein the member arrangement unit is configured to, when a member model to be arranged is selected, arrange the member model to match a corresponding location on the measured drawings via transform manipulation.

4. The apparatus of claim 1, further comprising:
a member model revision unit for revising a certain member model stored in the database.

5. The apparatus of claim 4, wherein the member model revision unit comprises a member model editing unit configured to, when an editing target is determined from the member models stored in the database, edit the editing target via transform manipulation.

6. The apparatus of claim 5, wherein the member model editing unit performs one or more of translation, rotation, and scaling on the editing target.

7. The apparatus of claim 4, wherein the member model revision unit comprises a mesh deformation unit configured to perform mesh deformation on a certain member model stored in the database.

8. The apparatus of claim 4, wherein the member model revision unit comprises:
a member model editing unit configured to, when an editing target is determined from the member models stored in the database, edit the editing target via transform manipulation; and
a mesh deformation unit configured to perform mesh deformation on a certain member model stored in the database.

9. The apparatus of claim 4, wherein the member model revision unit stores the revised member model in the database.

10. A computer-implemented method for three dimensional modeling a building to be modeled, comprising:
displaying on the touch screen, measured drawings that include information about members constituting a building to be modeled;
performing modeling based on multiple points to generate three-dimensional (3D) member models, the modeling being performed by sequentially generating faces by connecting the multiple points and sequentially generating objects by connecting the faces, and in conformity with the measured drawings which being arranged in their original locations and
in response to detection of selection of the generated objects, generating the 3D member models by performing mesh generation and texture mapping on the objects, wherein the generated objects are transformed into a mesh;
storing the member models in a database; and
arranging, by a member arrangement unit, each of the member models, stored in the database, at an original location thereof based on the measured drawings.

11. The method of claim 10, wherein the information about the members constituting the building to be modeled includes one or more of an actual size, an arrangement location, and a scale of each member.

12. The method of claim 10, wherein arranging each of the member models based on the measured drawings comprises, when a member model to be arranged is selected, arranging the member model to match a corresponding location on the measured drawings via transform manipulation.

13. The method of claim 10, further comprising:
revising, by a member model revision unit, a certain member model stored in the database.

14. The method of claim 13, wherein revising the certain member model comprises, when an editing target is determined from the member models stored in the database, editing the editing target via transform manipulation.

15. The method of claim 14, wherein revising the certain member model comprises performing one or more of translation, rotation, and scaling on the editing target.

16. The method of claim 13, wherein revising the certain member model comprises performing mesh deformation on a certain member model stored in the database.

17. The method of claim 13, wherein revising the certain member model comprises: when an editing target is determined from the member models stored in the database, editing the editing target via transform manipulation, and performing mesh deformation on a certain member model stored in the database.

18. The method of claim 13, wherein revising the certain member model comprises storing the revised member model in the database.

* * * * *